(12) United States Patent
Yang et al.

(10) Patent No.: US 12,294,043 B2
(45) Date of Patent: May 6, 2025

(54) DRIVE BACKPLANE AND PREPARATION METHOD THEREOF, DISPLAY PANEL, AND DISPLAY DEVICE

(71) Applicant: BOE Technology Group Co., Ltd., Beijing (CN)

(72) Inventors: Wei Yang, Beijing (CN); Ke Wang, Beijing (CN); Muxin Di, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1050 days.

(21) Appl. No.: 17/280,387

(22) PCT Filed: Jan. 22, 2020

(86) PCT No.: PCT/CN2020/073910
§ 371 (c)(1),
(2) Date: Mar. 26, 2021

(87) PCT Pub. No.: WO2021/147039
PCT Pub. Date: Jul. 29, 2021

(65) Prior Publication Data
US 2022/0115572 A1 Apr. 14, 2022

(51) Int. Cl.
*H01L 33/62* (2010.01)
*H01L 33/00* (2010.01)

(52) U.S. Cl.
CPC ............ *H01L 33/62* (2013.01); *H01L 33/005* (2013.01); *H01L 2933/0066* (2013.01)

(58) Field of Classification Search
CPC .............................. H01L 33/62; H01L 33/005
USPC .......................................................... 257/79
See application file for complete search history.

(56) References Cited

U.S. PATENT DOCUMENTS

| | | | |
|---|---|---|---|
| 2010/0238331 A1 | 9/2010 | Umebayashi et al. | |
| 2015/0187807 A1* | 7/2015 | Tsuruoka | H01L 23/481 257/347 |
| 2016/0093644 A1* | 3/2016 | Ki | H01L 27/1244 257/43 |
| 2017/0365652 A1 | 12/2017 | Li | |

(Continued)

FOREIGN PATENT DOCUMENTS

| | | |
|---|---|---|
| CN | 101840925 A | 9/2010 |
| CN | 104851892 A | 8/2015 |

(Continued)

OTHER PUBLICATIONS

Extended European Search Report for 20864304.9 dated Sep. 25, 2023.

*Primary Examiner* — Xia L Cross
(74) *Attorney, Agent, or Firm* — ArentFox Schiff LLP; Michael Fainberg

(57) ABSTRACT

The present application discloses a drive backplane and a preparation method thereof, a display panel, and a display device. The drive backplane includes a flexible substrate provided with a first via hole; a first passivation layer located on a side of the flexible substrate and provided with a second via hole, an orthographic projection of the second via hole being at least partially overlapped with an orthographic projection of the first via hole; a thin film transistor located on a side, facing away from the flexible substrate, of the first passivation layer; and an electrical connecting structure, including a signal trace and a connecting terminal.

16 Claims, 3 Drawing Sheets

(56) References Cited

U.S. PATENT DOCUMENTS

| | | |
|---|---|---|
| 2020/0286921 A1 | 9/2020 | Liu et al. |
| 2020/0350339 A1 | 11/2020 | Li et al. |
| 2021/0134775 A1 | 5/2021 | Liu et al. |
| 2021/0184181 A1* | 6/2021 | Ding .................... H10K 71/80 |
| 2021/0210522 A1 | 7/2021 | Liu et al. |
| 2021/0225901 A1 | 7/2021 | Luo et al. |

FOREIGN PATENT DOCUMENTS

| | | |
|---|---|---|
| CN | 108535928 A | 9/2018 |
| CN | 109559643 A | 4/2019 |
| CN | 109585462 A | 4/2019 |
| CN | 109817659 A | 5/2019 |
| CN | 109887948 A | 6/2019 |
| CN | 109904080 A | 6/2019 |
| CN | 110010627 A | 7/2019 |
| JP | 2002040472 A | 2/2002 |
| WO | 2020207013 A1 | 10/2020 |

* cited by examiner

DRIVE BACKPLANE AND PREPARATION METHOD THEREOF, DISPLAY PANEL, AND DISPLAY DEVICE

This disclosure is a US National Stage of International Application No. PCT/CN2020/073910, filed on Jan. 22, 2020, the content of which is hereby incorporated by reference in its entirety.

FIELD

The present application relates to the field of display technology, in particular to a drive backplane and a preparation method thereof, a display panel, and a display device.

BACKGROUND

In recent years, with the rapid development of display products, Micro-LED display products have become a hot spot for technology development. The integrated circuit chip (IC) of existing Micro-LED products is bonded (Bonding) to the front side of a screen, and the IC will occupy a certain area in the display area, resulting in a large stitching gap of the Micro-LED products. Aiming at this problem, a Trough PI Via (TPV) manufacturing process has been proposed, that is, a thin-film transistor (TFT) is directly manufactured on a flexible substrate (PI) and is connected to wires through vias on the flexible substrate (PI) to achieve Bonding of an IC on the back side of the flexible substrate (PI), which solves the problem that the IC occupies the display area and can achieve manufacturing of unframed backplanes at the same time. However, this method has a problem, that is, the metal structure of the connecting terminal (Bonding Pad) used for bonding ICs is manufactured under the flexible substrate and completely exposed to the air environment, resulting in easy oxidation and corrosion, which affects the yield of drive circuits.

SUMMARY

The present application discloses a drive backplane and a preparation method thereof, a display panel, and a display device, with the purposes of improving the structure of TPV drive backplanes and increasing the yield of the TPV backplanes.

In order to achieve the above purposes, the present application provides the following technical solution.

A drive backplane includes:

a flexible substrate on which a first via hole is provided;

a first passivation layer located on one side of the flexible substrate, the first passivation layer being provided with a second via hole, and the orthographic projection, on the flexible substrate, of the second via hole being at least partially overlapped with the orthographic projection, on the flexible substrate, of the first via hole;

a thin film transistor located on one side, facing away from the first passivation layer, of the flexible substrate; and an electrical connecting structure, including a signal trace and a connecting terminal; the connecting terminal being located on the side, close to the first passivation layer, of the flexible substrate and including a first portion located between the flexible substrate and the first passivation layer and a second portion located within the second via hole, and the orthographic projection, on the flexible substrate, of the second via hole being located within the orthographic projection, on the flexible substrate, of the connecting terminal; and the signal trace being located on the side, facing away from the first passivation layer, of the flexible substrate, electrically connected to the thin film transistor and electrically connected to the connecting terminal through the first via hole.

Optionally, the orthographic projection, on the flexible substrate, of the first via hole is located within the orthographic projection, on the flexible substrate, of the first via hole.

Optionally, the drive backplane further includes: a conductive structure located on the side, facing away from the flexible substrate, of the connecting terminal and electrically connected with the connecting terminal.

Optionally, the drive backplane further includes: an integrated circuit chip located on the side, facing away from the flexible substrate, of the first passivation layer and in bonding connection with the conductive structure.

Optionally, the conductive structure is located on the side, facing away from the flexible substrate, of the first passivation layer, and the orthographic projection, on the flexible substrate, of the connecting terminal is located within the orthographic projection, on the flexible substrate, of the conductive structure.

Optionally, the conductive structure is a corrosion-resistant conductive material.

Optionally, the material of the conductive structure includes ITO, IZO, Mo, MoNb and Ti.

Optionally, the first passivation layer is a SiOx and SiNx laminated structure, where a SiNx layer is close to the flexible substrate and a SiOx layer is away from the flexible substrate.

Optionally, the material of the first passivation layer includes SiN, SiON and SiOx.

Optionally, the edge profile of the first passivation layer is roughly aligned with the edge profile of the flexible substrate.

Optionally, the material of the connecting terminal is Ti/Al/Ti.

Optionally, the drive backplane further includes a second passivation layer located between the flexible substrate and the connecting terminal, the second passivation layer is provided with a third via hole, the third via hole and the first via are laminated, and the signal trace is electrically connected to the connecting terminal through the first via hole and the third via hole; the size of the opening on one side, facing the connecting terminal, of the third via hole is smaller than the size of the surface, facing the connecting terminal, of the third via hole.

A method for preparing a drive backplane includes the following steps:

forming a first passivation layer;

forming a second via hole in the first passivation layer;

preparing an electrical connecting structure, a flexible substrate and a thin film transistor on the first passivation layer; and forming a first via hole in the flexible substrate.

The orthographic projection, on the flexible substrate, of the first via hole is at least partially overlapped with the orthographic projection, on the flexible substrate, of the second via hole; where the electrical connecting structure includes a signal trace and a connecting terminal, the connecting terminal is located on the side, close to the first passivation layer, of the flexible substrate and includes a first portion located between the flexible substrate and the first passivation layer and a second portion located within the second via hole, and the orthographic projection, on the flexible substrate, of the second via hole is located within the orthographic projection, on the flexible substrate, of the connecting terminal; and the signal trace is located on the side, facing away from the first passivation layer, of the flexible substrate, electrically connected to the thin film transistor and electrically connected to the connecting terminal through the first via hole.

Optionally, before forming the first passivation layer, the method further includes:

providing a rigid substrate; and forming a sacrificial layer on the rigid substrate; where the forming the first passivation layer specifically includes:

forming the first passivation layer on the sacrificial layer; and after the preparing the electrical structure, the flexible substrate and the thin film transistor on the first passivation layer, the method further includes:

sacrificing the sacrificial layer to peel off the rigid substrate.

Optionally, after peeling off the rigid substrate, the method further includes: bonding an integrated circuit chip to the side, facing away from the flexible substrate, of the first passivation layer, where the integrated circuit chip is electrically connected to the connecting terminal through the second via hole.

Optionally, the preparing the electrical connecting structure, the flexible substrate and the thin film transistor on the first passivation layer specifically includes:

preparing the connecting terminal on the first passivation layer;

preparing the flexible substrate on the connecting terminal; and preparing the signal trace and the thin film transistor on the flexible substrate.

Optionally, the preparing the connecting terminal on the first passivation layer specifically includes: preparing a Ti/Al/Ti laminated structure on the first passivation layer, and forming the graph of the connecting terminal by using a dry etching process.

Optionally, before forming the first passivation layer, the method further includes: preparing a conductive material layer on the sacrificial layer, and forming a graph of the conductive structure by a composition process; where the forming the first passivation layer specifically includes: depositing a passivation material layer and forming the second via hole on the passivation material layer by a dry etching process, where the orthographic projection, on the flexible substrate, of the second via hole is located within an orthographic projection, on the flexible substrate, of the conductive structure.

Optionally, the forming a first passivation layer specifically includes: depositing a passivation material layer, which includes one or more of SiN, SiON and SiOx; and forming the second via hole by performing wet etching on the passivation material layer by using an HF etching solution.

A display device includes the drive backplane according to any one aforementioned and a display element.

DETAILED DESCRIPTION OF THE EMBODIMENTS

The technical solutions in embodiments of the present application will be clearly and completely described below in conjunction with the accompanying drawings in the embodiments of the present application. Apparently, the embodiments described are merely part of the embodiments of the present application, rather than all of them. All other embodiments obtained by those of ordinary skill in the art based on the embodiments in the present application without creative efforts are within the protection scope of the present application.

Figure 1:
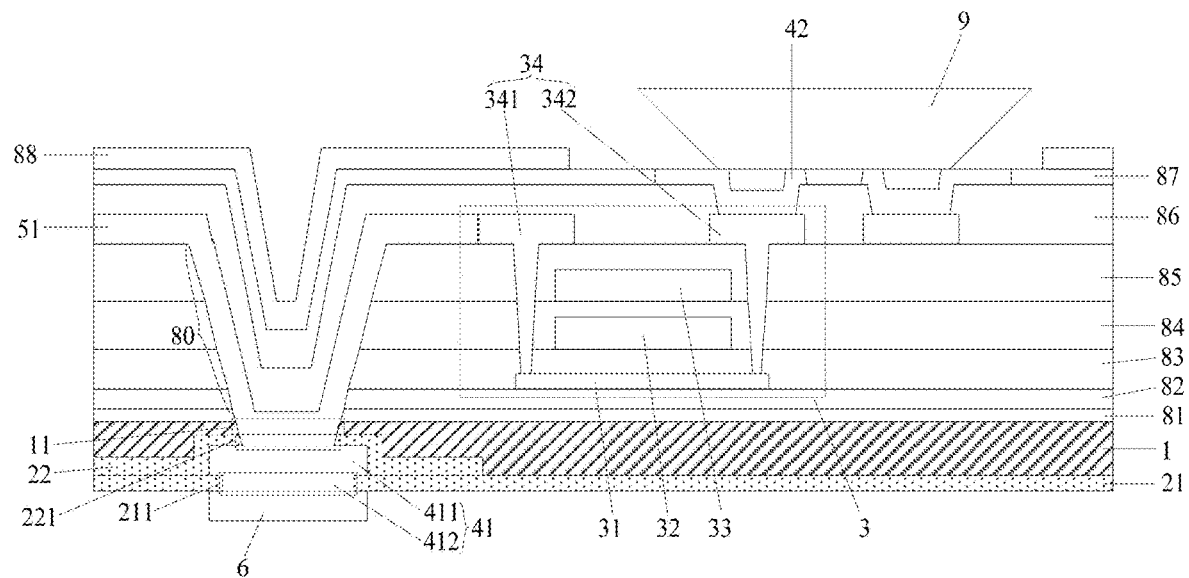
FIG. 1 is a schematic diagram of a cross-sectional structure of a drive backplane provided by an embodiment of the present application.
Figure 2:
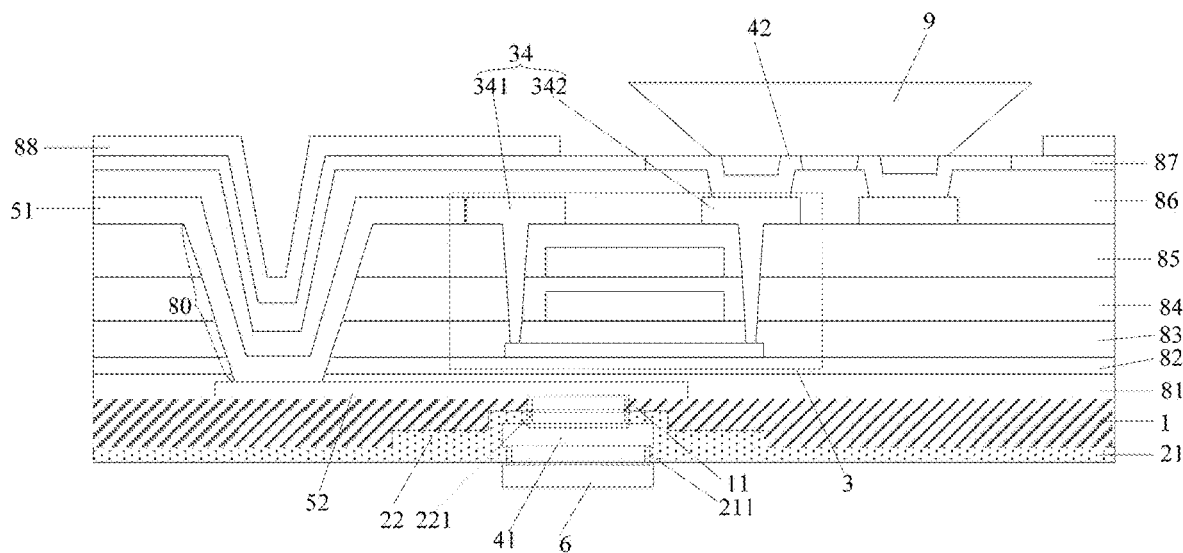
FIG. 2 is a schematic diagram of a cross-sectional structure of a drive backplane provided by another embodiment of the present application.

As shown in FIG. 1 and FIG. 2, embodiments of the present application provide a drive backplane, including:

a flexible substrate 1 on which a first via hole 11 is provided;

a first passivation layer 21 located on one side of the flexible substrate 1, where the first passivation layer 1 is provided with a second via hole 211, and an orthographic projection, on the flexible substrate 1, of the second via hole 211 is at least partially overlapped with an orthographic projection, on the flexible substrate 1, of the first via hole 11;

a thin film transistor 3 located on one side, facing away from the first passivation layer 21, of the flexible substrate 1; and an electrical connecting structure, including one or more signal traces and one or more connecting terminals 41, where the connecting terminal 41 is located on a side, close to the first passivation layer 21, of the flexible substrate 1 and includes a first portion 411 located between the flexible substrate 1 and the first passivation layer 21 and a second portion located within the second via hole 211, and the orthographic projection, on the flexible substrate 1, of the second via hole 211 is located within an orthographic projection, on the flexible substrate 1, of the connecting terminal 41; and the signal trace (e.g., a signal wire 51 in FIG. 1 or signal wires 51, 52 in FIG. 2) is located on the side, facing away from the first passivation layer 21, of the flexible substrate 1, electrically connected to the thin film transistor 3 and electrically connected to the connecting terminal 41 through the first via hole 11.

As for the above-mentioned drive backplane, the connecting terminal 41 for binding an IC 6 is located on one side of the flexible substrate 1 and is electrically connected to a thin film transistor 3 in a pixel driving circuit located on the other side of the flexible substrate 1 through the first via hole 11 on the flexible substrate 1, so that the drive backplane is a backplane structure that uses the Trough PI Via (TPV) of the substrate to achieve bonding of the IC 6 to the back side of the substrate, thereby solving the problem that IC 6 occupies a display area and realizing manufacturing of unframed backplanes.

Moreover, as for the above-mentioned drive backplane, the back side (the side where the connecting terminal 41 is provided) of the flexible substrate 1 is provided with the first passivation layer 21. The first passivation layer 21 is provided with the second via hole 211 through which the bonding connection of the connecting terminals 41 and the IC 6 is achieved. The connecting terminal 41 includes a first portion 411 and a second portion 412. The first portion 411 is located between the layer where the flexible substrate 1 is located and the layer where the first passivation layer 21 is located, and is not exposed to the outside, so that it will not be corroded. The second portion 412 is located in the second via hole 211 and its periphery is coated with the first passivation layer 21, so that corrosion can be avoided. Therefore, in the above-mentioned drive backplane, the connecting terminal 41 is not directly exposed to the outside, and its side face can be effectively protected from being oxidized and corroded, which in turn can improve the yield of TPV drive backplanes.

Figure 3:
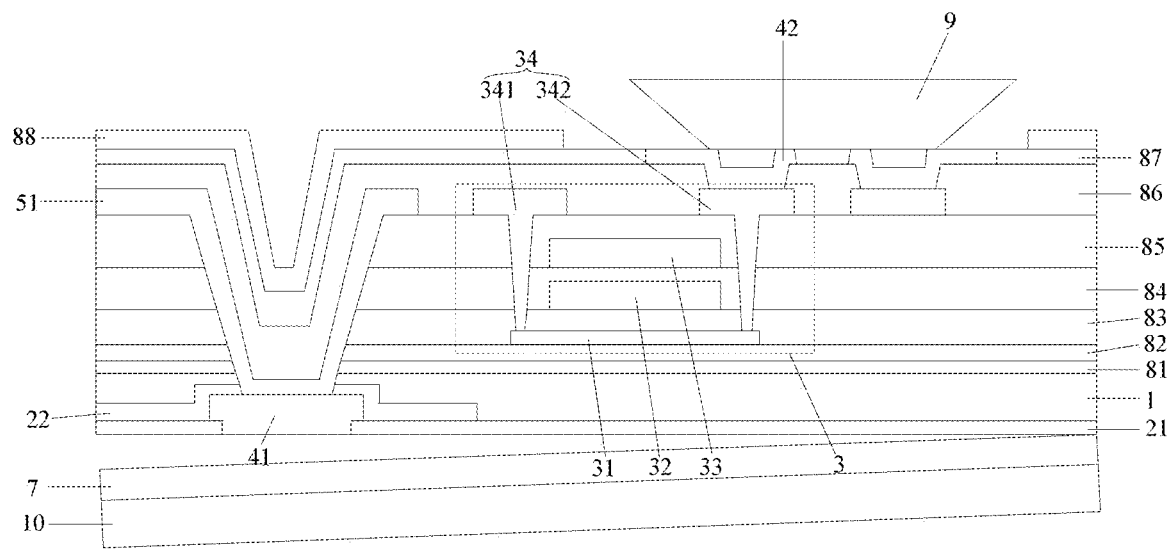
FIG. 3 is a schematic diagram of a cross-sectional structure of a drive backplane provided by an embodiment of the present application in a peeling-off process.

In addition, as shown in FIG. 3, in the manufacturing process of the TPV drive backplane, it is generally made by forming a sacrificial layer (DBL) 7 on a rigid substrate 10 at first, and then preparing a metal structure layer of the connecting terminal 41, the flexible substrate 1, and a pixel drive circuit (including TFT 3) in sequence. The sacrificial layer 7 is used for peeling off the rigid substrate 10. If the sacrificial layer 7 is damaged, the peeling off of the rigid substrate 10 will be affected.

In the related art, the connecting terminal 41 is directly prepared on the sacrificial layer 7. In order to avoid damage on the surface of the sacrificial layer 7 when the connecting terminal 41 is prepared, the wet etching process is preferably used for the connecting terminal 41, and dry etching needs to be avoided, thus selection of the material of the connecting terminal 41 is greatly limited.

The drive backplane in the technical solution of the present application, as shown in FIG. 3, is provided with a first passivation layer 21 between the connecting terminal 41 and the sacrificial layer 7, and the composition process of the connecting terminal 41 will not affect the sacrificial layer 7, so that the connecting terminal 41 can be formed by any of the composition processes. For example, when the dry etching process is used for the connecting terminal 41, etching to the sacrificial layer 7 can be avoided due to the first passivation layer 21 provided below, so that the peeling off of the rigid substrate 10 will not be affected.

Specifically, as shown in FIG. 3, the sacrificial layer 7 is a polyimide (PI)-like material that can be decomposed after high energy irradiation of a laser lift-off (LLO) process, thus allowing separation of the connecting terminal 41 and the flexible substrate 1 structure from the rigid substrate 10.

In some embodiments, as shown in FIG. 3, the edge profile of the first passivation layer 21 is roughly aligned with the edge profile of the flexible substrate 1, that is, the first passivation layer is a film layer provided with a via hole in the partial area. In this way, when the dry etching process is used for preparing the connecting terminal 41, the sacrificial layer 7 under the substrate 1 can be retained, and then the flexible substrate 1 and the rigid substrate 10 can be peeled off completely and well in the subsequent peeling-off process.

In some embodiments, the connecting terminal 41 is of a metal laminated structure, such as a titanium/aluminum/titanium (Ti/Al/Ti) structure.

The resistance of the Ti/Al/Ti material is very small, and the connecting terminal 41 uses the above-mentioned film layer material, which reduce the power consumption of display products and improve the display effect of the display products.

Of course, the material of the connecting terminal 41 can also be other metal material, such as copper (Cu), and in this case, the graph of the connecting terminal 41 is formed by using the wet etching process.

Further, as shown in FIGS. 1 and 2, the drive backplane of the present application further includes an integrated circuit chip (IC) 6, and the IC 6 is located on the side, facing away from the flexible substrate 1, of the first passivation layer 21 and used for bonding connection with the connecting terminals 41.

In some embodiments, as shown in FIGS. 1 and 2, the orthographic projection, on the flexible substrate 1, of the first via hole 11 of the flexible substrate 1 is located within the orthographic projection, on the flexible substrate 1, of the second via hole 211 of the first passivation layer 21.

The connecting terminal 41 needs to be electrically connected to the thin film transistor 3 in the pixel drive circuit on the other side of the flexible substrate 1 through the first via hole 11, and the orthographic projection of the first via hole 11 is arranged within the orthographic projection of the second via hole 211, so that the orthographic projection of the first via hole 11 is located within the orthographic projection of the connecting terminal 41, and thus lap joint between the thin film transistor 3 in the pixel circuit and the connecting terminals 41 is realized through the signal traces.

Specifically, the connecting terminal 41 is electrically connected to the source-drain electrode 34 of the thin film transistor (TFT) 3 in the pixel drive circuit through the first via hole 11. In addition to functional structures such as the flexible substrate 1 and the pixel drive circuit, e.g., an active layer 31, a first gate 32 and a second gate 33, insulating structure layers such as a barrier layer (Barrier) 81, a buffer layer (Buffer) 82, a first gate insulating layer (GI1) 83, a second gate insulating layer (GI2) 84 and an interlayer insulating layer (ILD) 85 are also included between the layer where the connecting terminal 41 is located and the source-drain electrode layer of the thin film transistor 3. The above-mentioned insulating structure layers are provided with a via hole respectively, which can be referred to as a fourth via hole 80, and the fourth via hole 80 is a through hole penetrating through all of the above-mentioned insulating structure layers. The source-drain electrode 34 of the thin film transistor 3 in the pixel drive circuit is electrically connected to the connecting terminal 41 through the first via hole 11 and the fourth via holes 80.

Specifically, the connecting terminals 41 and the signal traces are in a one-to-one corresponding relation, and each connecting terminal 41 is electrically connected to the thin film transistor of the pixel drive circuit through the corresponding signal trace.

Exemplarily, as shown in FIG. 1, the signal trace includes a signal wire 51 prepared in the same layer as the source-drain electrode 34 of the thin film transistor 3. The first via hole 11 in the flexible substrate 1 is communicated with the fourth via holes 80 in the insulating structure layers, and the signal wire 51 is lapped with the connecting terminal 41 through the fourth via holes 80 and the first via hole 11 to realize the electrical connection between the pixel drive circuit and the connecting terminal 41.

Or, exemplarily, a layer of signal wires 52 can also be prepared between the flexible substrate 1 and any two of the insulating structure layers, and one end of each signal wire 52 is electrically connected to the corresponding signal wire 51 in the source-drain electrode layer through via holes in a part of the insulating layers, and the other end of the each signal wire 52 is electrically connected to the corresponding connecting terminal 41 through via holes in the other part of the insulating layers. That is, the signal trace includes the signal wire 51 and the signal wire 52, and the pixel drive circuit is electrically connected to the connecting terminal 41 through the signal wire 51 and the signal wire 52. For example, as shown in FIG. 2, a layer of signal wires 52 may be prepared between the flexible substrate 1 and the barrier layer (Barrier) 81, and each source electrode 341 in the source-drain electrode layer is connected to the corresponding signal wire 51, while each signal wire 51 is lapped to one end of the corresponding signal wire 52 through the fourth via hole 80. Further, the other end of the each signal wire 52 is connected to the corresponding connecting terminal 41 through the first via hole 11 of the flexible substrate 1, so that electrical connection between the TFT 3 of the pixel drive circuit and the corresponding connecting terminal 411 can be achieved. Of course, a layer of signal wires may also be prepared in the layer where the first gate 32 is located or the layer where the second gate 32 is located, so as to facilitate the lap joint between the source-drain electrode 34 of the TFT 3 and the corresponding connecting terminal 411, and their lap joint principle is the same as above, which is not repeated here.

Specifically, as shown in FIGS. 1 and 2, the side, facing away from the flexible substrate 1, of the pixel drive circuit may be provided with pin terminals 42, where the pin terminals 42 are used for bonding connection with cathode and anode electrode pins of a micro LED chip 9.

Figure 6:
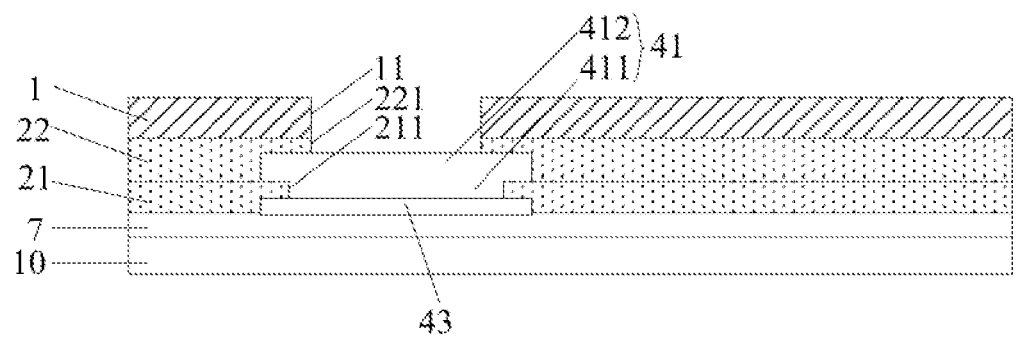
FIG. 6 is a schematic diagram of a partial cross-sectional structure of a drive backplane provided by another embodiment of the present application.

In some embodiments, as shown in FIG. 6, the drive backplane of the present application may also include one or more conductive structures 43, which are located on the side, facing away from the flexible substrate 1, of the connecting terminals 41 and electrically connected to the connecting terminals 41.

Specifically, each conductive structure 43 is electrically connected to the corresponding connecting terminal 41, and the graph of the orthographic projection, on the flexible substrate 1, of the conductive structure 43 may be similar to the graph of the orthographic projection, on the flexible substrate 1, of the connecting terminal 41, and the conductive structure 43 is used as a binding contact layer for the connecting terminal 41, i.e., in the drive backplane in embodiments of the present application, the IC is specifically in bonding contact with the conductive structure 43.

Specifically, as the binding contact layer for the connecting terminal 41, the conductive structure 43 may be a corrosion-resistant conductive material to avoid being corroded.

Specifically, the material of the conductive structure 43 includes ITO, IZO, Mo, MoNb, Ti, etc.

Optionally, the conductive structure 43 is located on the side, facing away from the flexible substrate 1, of the first passivation layer 21, and the orthographic projection, on the flexible substrate 1, of the connecting terminal 41 is located within the orthographic projection, on the flexible substrate 1, of the conductive structure 43, that is, the orthographic projection of the graph of the conductive structure 43 covers the orthographic projection of the graph of the connecting terminal 41.

Figure 4:
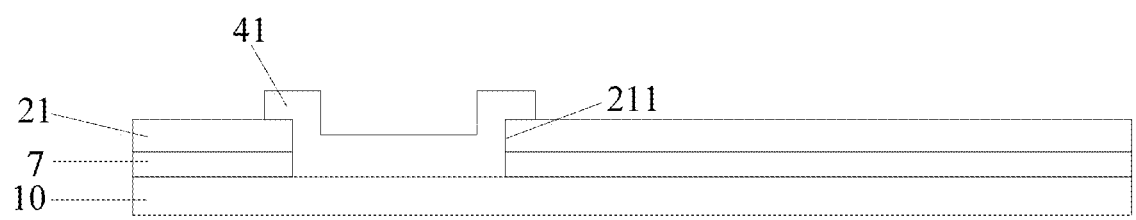
FIG. 4 is a schematic diagram of a partial cross-sectional structure of a drive backplane provided by a related art.

During the actual process, the passivation layer is generally thicker, and the sacrificial layer is generally thinner. For example, specifically, as shown in FIG. 4, the first passivation layer 21 is about 2000 Å and the sacrificial layer 7 ranges from 50 Å to 1000 Å, such as 50 Å or 1000 Å. When the dry etching process is used for the composition, the etching rate of a dry etching gas on the sacrificial layer 7 is greater than its etching rate on the passivation layer. Therefore, when the first passivation layer 21 is dry etched, the dry etching gas (plasma) can easily completely etch away the sacrificial layer 7 in the second via hole 211. In this case, as shown in FIG. 4, the connecting terminal 41 located at the second via hole 211 will be in direct contact with the rigid substrate 10, and when the peeling-off process of the rigid substrate 10 is performed, the connecting terminal 41 cannot be separated from the rigid substrate 10, which in turn affects the bonding of the connecting terminal 41 and the IC.

Figure 5:
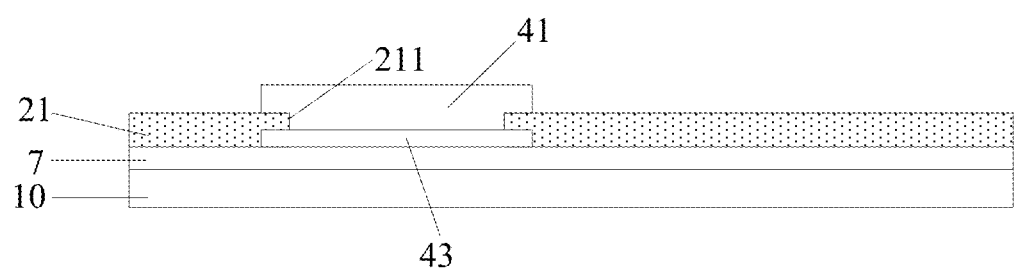
FIG. 5 is a schematic diagram of a partial cross-sectional structure of a drive backplane provided by an embodiment of the present application.

In the technical solution of the present application, as shown in FIGS. 5 and 6, a conductive structure 43 is prepared on the side, facing away from the flexible substrate, of the connecting terminal 41, i.e., after the preparation of the sacrificial layer 7 is completed, the graph of the conductive structure 43 is prepared on the sacrificial layer 7 at first, the wet etching process is used for composition of the conductive structure 43, and will not damage the sacrificial layer 7, then the first passivation layer 21 is deposited, and a second via hole 211 is formed in the first passivation layer 21. The second via hole 211 is arranged at the conductive structure 43, that is, there is a conductive structure 43 under the second via hole 211, so that when the dry etching process is used to form the second via hole 211, it can avoid etching to the sacrificial layer 7 below, that is, the sacrificial layer 7 under the second via hole 211 can be retained, which in turn may ensure that the connecting terminal 41 and the rigid substrate 10 can be well separated, so as to ensure the bonding effect of the connecting terminal 41 and the IC.

In some embodiments, in the drive backplane of the present application, a plurality of connecting terminals may be gathered to form a bonding structure, and each bonding structure is used for correspondence and bonding connection with a plurality of PINS of an integrated circuit chip (IC).

In some embodiments, the area where a bonding structure is located is referred to as a bonding area (Bonding area). In the drive backplane of the present application, a plurality of bonding areas can be distributed on the back side of the flexible substrate, and the bonding areas can be located in either a display area or a non-display area. The connecting terminal in each bonding area is correspondingly electrically connected to the drive circuit of a part of pixels (TFT), and the IC bonded to the connecting terminal of this bonding area is used for driving this part of pixels. Specifically, the signal trace electrically connected to the connecting terminal of this bonding area can be diffused in a shape of fan or circle taking the bonding area as the center, and the other end of the signal trace is connected to the corresponding pixel drive circuit.

In some embodiments, the first passivation layer 21 may be a SiOx and SiNx laminated structure. Exemplarily, the dry etching process may be used for composition of the first passivation layer 21 to form the second via hole 211.

Due to the inherent properties of the material, SiOx is easier to be separated from the sacrificial layer 7 compared with SiNx, while SiNx has better insulation properties than SiOx. Therefore, in the first passivation layer 21, the SiOx layer is away from the flexible substrate 1 and close to the sacrificial layer 7, and the SiNx layer is close to the flexible substrate 1 and away from the sacrificial layer 7.

In other embodiments, the material of the first passivation layer 21 includes SiN, SiON and SiOx. Exemplarily, at this moment, the wet etching process can be used for composition of the first passivation layer 2 to form the second via hole 211, specifically, a certain concentration of hydrogen fluoride (HF) etching solution can be used to form the second via hole 211 through a wet etching process. As shown in FIG. 3, the HF etching solution will not cause damage to the sacrificial layer 7, therefore, even if no conductive structure is provided, the sacrificial layer 7 under the second via hole 211 will not be corroded, so that it may ensure that the connecting terminal 41 can be separated from the rigid substrate 10.

In some embodiments, as shown in FIGS. 1-3 and 6, the drive backplane of the present application may also include a second passivation layer 22 located between the flexible substrate 1 and the connecting terminal 41. The second passivation layer 22 is provided with a third via hole 221, where the third via hole 221 and the first via hole 11 are laminated, and the signal trace is electrically connected to the connecting terminal 41 through the first via hole 11 and the third via hole 221.

Specifically, as shown in FIG. 6, the size of the opening on the side, facing the connecting terminal 41, of the third via hole 221 is smaller than the size of the surface of the side, facing the third via hole 221, of the connecting terminal 41. In this way, the side face of the connecting terminal 41 and the edge area of the surface of the side, facing the third via hole 221, of the connecting terminal 41 will be coated by the second passivation layer 22, that is, the second passivation layer 22 coats the side face and surface edge of the second portion 412 of the connecting terminal 41, which can avoid oxidation and corrosion of the connecting terminal 41 caused by water vapor in the material of the flexible substrate 1 and the high temperature heating (OVEN) process in the subsequent process. Specifically, the size of the opening on the side, facing the connecting terminal, of the third via hole depends on the shape of the opening, for example, when the shape of the opening is a circle, the size of the opening is the diameter of the circle, and when the shape of the opening is a polygon, the size of the opening is the diagonal of the polygon. Similarly, the size of the surface, facing the third via hole, of the connecting terminal depends on the shape of the surface. For example, when the shape of the surface is circle, the size of the surface is the diameter of the circle, and when the shape of the surface is a polygon, the size of the surface is the diagonal of the polygon.

Specifically, the second passivation layer 22 may be a whole-layer structure aligned with the edge of the flexible substrate 1, or it may only cover the bonding area or only cover the connecting terminal 41, as shown in FIGS. 1 to 3, which specifically depends on actual needs.

Figure 7:
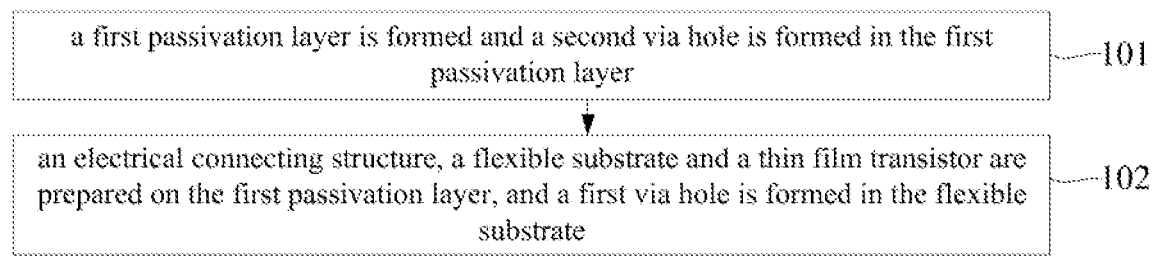
FIG. 7 is a flow chart of a preparation method of a drive backplane provided by an embodiment of the present application.

Based on the same inventive concept as the drive backplane provided in embodiments of the present application, embodiments of the present application further provide a preparation method of a drive backplane, as shown in FIG. 7, the method includes the following steps.

Step 101, a first passivation layer is formed and a second via hole is formed in the first passivation layer.

Step 102, an electrical connecting structure, a flexible substrate and a thin film transistor are prepared on the first passivation layer, and a first via hole is formed in the flexible substrate.

The orthographic projection, on the flexible substrate, of the first via hole is at least partially overlapped with the orthographic projection, on the flexible substrate, of the second via hole. The electrical connecting structure includes a signal trace and a connecting terminal. The connecting terminal is located on the side, close to the first passivation layer, of the flexible substrate and includes a first portion located between the flexible substrate and the first passivation layer and a second portion located within the second via hole. The orthographic projection, on the flexible substrate, of the second via hole is located within the orthographic projection, on the flexible substrate, of the connecting terminal. The signal trace is located on the side, facing away from the first passivation layer, of the flexible substrate, electrically connected to the thin film transistor and electrically connected to the connecting terminal through the first via hole.

In some embodiments, as shown in FIG. 3, before step 101, i.e., before forming the first passivation layer, the method further includes: providing the rigid substrate 10, and forming the sacrificial layer 7 on the rigid substrate 10.

Specifically, the material of the rigid substrate 10 may be glass, quartz, plastic, polymethyl methacrylate, and other materials.

In step 101, forming a first passivation layer specifically includes: a first passivation layer 21 is formed on the sacrificial layer 7.

After step 102, i.e., after preparing the electrical connecting structure, the flexible substrate 1 and the thin film transistor 3 on the first passivation layer 21, the method further includes: the sacrificial layer 7 is sacrificed to peel off the rigid substrate 10.

Specifically, the laser lift-off (LLO) process can be used to decompose the sacrificial layer 7, thereby separating the rigid substrate 10 from the first passivation layer 21.

In some embodiments, after peeling off the rigid substrate, the method may further include the following steps.

As shown in FIGS. 1 and 2, an integrated circuit chip (IC) 6 is bonded to the side, facing away from the flexible substrate 1, of the first passivation layer 21, and the integrated circuit chip 6 is electrically connected to the connecting terminal 41 through the second via hole 211.

In some embodiments, the preparing the electrical connecting structure, the flexible substrate and the thin film transistor on the first passivation layer may specifically include: as shown in FIGS. 1 and 2, the connecting terminal 41 is prepared on the first passivation layer 21; the flexible substrate 1 is prepared on the connecting terminal 41; and the signal trace (e.g., a signal wire 51 in FIG. 1 or signal wires 51, 52 in FIG. 2) and the thin film transistor 3 are prepared on the flexible substrate 1.

Exemplarily, as shown in FIGS. 1 and 2, the connecting terminal 41 is prepared on the first passivation layer 21, which may specifically include: a Ti/Al/Ti laminated structure is prepared on the first passivation layer 21, and the graph of the connecting terminal 41 is formed by using a dry etching process.

The resistance of the Ti/Al/Ti material is very small, and the connecting terminal uses the above-mentioned film layer material, which can reduce the power consumption of display products and improve the display effect of the display products.

Of course, the material of the connecting terminal is not limited to Ti/Al/Ti, it can also be other metal material, such as copper (Cu), and by this time, the graph of the connecting terminal is formed using the wet etching process.

In some embodiments, as shown in FIGS. 5 and 6, before forming the first passivation layer 21, the method may further include: preparing a conductive material layer on the sacrificial layer 7, and forming graphs of the conductive structures 43 by a composition process.

The conductive structures 43 are graphical structures, and are in one-to-one correspondence with the connecting terminals 41, and each conductive structure 43 is used as a bonding contact layer for the corresponding connecting terminal 41, and the graph of the orthographic projection on the flexible substrate 1 may be similar to that of the orthographic projection, on the flexible substrate 1, of the corresponding connecting terminal 41.

Specifically, as the binding contact layer for the connecting terminal 41, the conductive structure 43 may be a corrosion-resistant conductive material to avoid being corroded. The material of the conductive structure 43 may specifically include ITO, IZO, Mo, MoNb, Ti, etc.

Further, as shown in FIG. 5 and FIG. 6, forming the first passivation layer 21 may further include: a passivation material layer is deposited and the second via hole 211 is formed on the passivation material layer by a dry etching process, wherein the orthographic projection, on the flexible substrate 1, of the second via hole 211 is located within the orthographic projection, on the flexible substrate 1, of the conductive structure 43.

Specifically, the passivation material layer may be a SiOx and SiNx laminated structure, where the SiOx layer is close to the sacrificial layer 7, and the SiNx layer is away from the sacrificial layer 7.

Specifically, as shown in FIGS. 5 and 6, the connecting terminal 41 subsequently prepared on the first passivation layer 21 is electrically connected with the conductive structure 43 through the second via hole 211.

The second via hole 211 is arranged at the conductive structure 43, that is, there is a conductive structure 43 under the second via hole 211, so that when the dry etching process is used to form the second via hole 211, it can avoid etching to the sacrificial layer 7 below, that is, the sacrificial layer 7 under the second via hole 211 can be retained, which in turn may ensure that a glass substrate 10 can be well separated at the connecting terminal 41, so as to ensure the bonding effect of the connecting terminal 41 and the IC.

In other embodiments, forming the first passivation layer 21 may specifically include: a passivation material layer is deposited, which includes one or more of SiN, SiON and SiOx; and wet etching is performed on the passivation material layer by using an HF etching solution to form the second via hole.

As shown in FIGS. 5 and 6, the HF etching solution is used for etching to form the second via hole 211, and the HF etching solution will not damage the sacrificial layer 7, therefore, even if no conductive structure 43 is provided, the sacrificial layer 7 under the second via hole 211 will not be corroded, so that it may ensure that the connecting terminal 41 can be well separated from the glass substrate, thus ensuring the bonding effect of the connecting terminal 41 and the IC.

In some embodiments, as shown in FIGS. 1 to 3, the method for preparing the drive backplane may specifically include the following procedures.

Step 201, the sacrificial layer 7 is deposited on the rigid substrate 10.

Step 202, a first passivation layer (PVX1) 21, a connecting terminal 41, a second passivation layer (PVX2) 22, a flexible substrate (PI) 1, a barrier layer (Barrier) 81, a buffer layer (Buffer) 82, and an active layer (Active) 31 are manufactured in sequence on the sacrificial layer 7. Wherein, the material of PVX1 may be selected from SiOx/SiNx, the material of PVX2 may be selected from SiNx, the material of Barrier may be selected from SiOx, the material of Buffer may be selected from SiNx/SiOx, and Active is a patterned structure.

Step 203, a first gate insulating layer (GI1) 83, a first gate (Gate1) 32, a second gate insulating layer (GI2) 84, a second gate (Gate2) 33, and an interlayer insulating layer (ILD) 85 are manufactured in sequence. The materials of GI1 and GI2 may be SiNx/SiOx, and Gate1 and Gate2 are patterned structures.

Step 204, deep holes penetrating through the interlayer insulating layer (ILD) 85, the second gate insulating layer (GI2) 84, the first gate insulating layer (GI1) 83, the buffer layer (Buffer) 82, the barrier layer (Barrier) 81, the flexible substrate (PI) 1 and the second passivation layer (PVX2) 22 are formed in sequence through 1-3 times of etching to expose the connecting terminal 41.

Step 205, via holes penetrating through the interlayer insulating layer (ILD) 85, the second gate insulating layer (GI2) 84 and the first gate insulating layer (GI1) 83 are formed in sequence through etching to expose a part of the active layer 31.

Step 206, a source drain (SD) 34 which is lapped with the active layer 31 and the connecting terminal 41 respectively is manufactured.

Step 207, a flattening layer (PLN) 86 is manufactured on the source-drain electrode (SD) 34.

Step 208, pin terminals 42 are manufactured on the flattening layer (PLN) 86 for Bonding with the micro LED chip 9.

Step 209, a passivation layer (PVX) 87 is manufactured on the pin terminals 42 to prevent the side face of the pin terminal 42 from being oxidized.

Step 210, a black matrix (BM) 88 with the function of preventing the light emitted from the micro LED chip 9 from irradiating the drive circuit array (array) and then being reflected out to affect the display effect is manufactured. Specifically, the BM 88 has an opening to expose the pin terminals 42 to facilitate the bonding connection of the pin terminals 42 and the micro LED chip 9. The edge of the opening of the BM 88 can extend to the edges of the pin terminals to shield the area outside the pin terminals 42 as much as possible to avoid emission of reflected light.

Step 211, the micro LED chip 9 is transferred to the drive backplane, and bonding (Bonding) and packaging (Packaging) the micro LED chip 9.

Step 212, after the above-mentioned drive backplane is manufactured, LLO is used to separate the rigid substrate 10 from the backplane above.

Step 213, the IC 6 is bonded on the back side of the drive backplane.

Moreover, embodiments of the present application further provide a display device, which includes the drive backplane according to any one aforementioned and a display element.

The above-mentioned display device is a TPV display device that bonds the IC to the back side of the flexible substrate, which solves the problem that the IC occupies the display area and realizes manufacturing of unframed backplanes. Moreover, in the above-mentioned display device, the connecting terminal on the back side of the flexible substrate is not exposed to the outside, and the side face of the connecting terminal is effectively protected, oxidization and corrosion can be prevented, which in turn can improve the yield of TPV display devices. In addition, in the display device of the present application, the connecting terminal can use either the wet etching process or the dry etching process. There are many selections for materials, specifically, materials with good electrical conductivity can be selected to reduce the power consumption of display products and improve the display effect of the display products.

Specifically, in the display device of the present application, the display element may be a micro LED chip.

Although the preferred embodiments of the present disclosure have been described, those skilled in the art can make other changes and modifications to these embodiments once they learn the basic inventive concept. Therefore, the appended claims are intended to be construed as including the preferred embodiments and all changes and modifications falling within the scope of the present disclosure.

Obviously, those skilled in the art can make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent technologies, the present disclosure is also intended to include these modifications and variations.

What is claimed is:

1. A drive backplane, comprising:
a flexible substrate on which a first via hole is provided;
a first passivation layer located on one side of the flexible substrate, wherein the first passivation layer is provided with a second via hole, and an orthographic projection, on the flexible substrate, of the second via hole is at least partially overlapped with an orthographic projection, on the flexible substrate, of the first via hole;
a thin film transistor located on a side, facing away from the first passivation layer, of the flexible substrate; and
an electrical connecting structure, comprising a signal trace and a connecting terminal; wherein the connecting terminal is located on a side, close to the first passivation layer, of the flexible substrate and comprises a first portion located between the flexible substrate and the first passivation layer and a second portion located within the second via hole, and the orthographic projection, on the flexible substrate, of the second via hole is located within an orthographic projection, on the flexible substrate, of the connecting terminal; and the signal trace is located on the side, facing away from the first passivation layer, of the flexible substrate, is electrically connected to the thin film transistor and electrically connected to the connecting terminal through the first via hole;
wherein the drive backplane further comprises:
a second passivation layer located between the flexible substrate and the connecting terminal,
wherein the second passivation layer is provided with a third via hole, the third via hole and the first via hole penetrate through each other along a thickness direction of the second passivation layer, and the signal trace is electrically connected to the connecting terminal through the first via hole and the third via hole;
a size of an opening on a side, facing the connecting terminal, of the third via hole is smaller than a size of a surface of a side, facing the third via hole, of the connecting terminal; and
a side face of the connecting terminal and an edge area of the surface of the side, facing the third via hole, of the connecting terminal are coated by the second passivation layer, so that the second passivation layer coats the side face and a surface edge of the second portion of the connecting terminal.

2. The drive backplane according to claim 1, wherein the orthographic projection, on the flexible substrate, of the first via hole is located within the orthographic projection, on the flexible substrate, of the second via hole.

3. The drive backplane according to claim 1, further comprising:
a conductive structure located on a side, facing away from the flexible substrate, of the connecting terminal and electrically connected to the connecting terminal.

4. The drive backplane according to claim 3, further comprising:
an integrated circuit chip located on a side, facing away from the flexible substrate, of the first passivation layer and in bonding connection with the conductive structure.

5. The drive backplane according to claim 3, wherein the conductive structure is located on the side, facing away from the flexible substrate, of the first passivation layer, and the orthographic projection, on the flexible substrate, of the connecting terminal is located within an orthographic projection, on the flexible substrate, of the conductive structure.

6. The drive backplane according to claim 3, wherein the conductive structure is a corrosion-resistant conductive material.

7. The drive backplane according to claim 6, wherein the material of the conductive structure comprises at least one of Indium tin oxide (ITO), Indium Zinc Oxide (IZO), molybdenum (Mo), MoNb and Ti.

8. The drive backplane according to claim 1, wherein the first passivation layer is a SiOx and SiNx laminated structure, and a SiNx layer is close to the flexible substrate, and a SiOx layer is away from the flexible substrate.

9. A method for preparing a drive backplane, comprising:
forming a first passivation layer;
forming a second via hole in the first passivation layer;
preparing an electrical connecting structure, a flexible substrate and a thin film transistor on the first passivation layer; and
forming a first via hole in the flexible substrate;
wherein an orthographic projection, on the flexible substrate, of the first via hole is at least partially overlapped with an orthographic projection, on the flexible substrate, of the second via hole; the electrical connecting structure comprises a signal trace and a connecting terminal, the connecting terminal is located on a side, close to the first passivation layer, of the flexible substrate and comprises a first portion located between the flexible substrate and the first passivation layer and a second portion located within the second via hole, and the orthographic projection, on the flexible substrate, of the second via hole is located within an orthographic projection, on the flexible substrate, of the connecting terminal; and the signal trace is located on the side, facing away from the first passivation layer, of the flexible substrate, is electrically connected to the thin film transistor and electrically connected to the connecting terminal through the first via hole;
characterized in that, the method further comprises:
forming a second passivation layer located between the flexible substrate and the connecting terminal;
wherein the second passivation layer is provided with a third via hole, the third via hole and the first via hole penetrate through each other along a thickness direction of the second passivation layer, and the signal trace is electrically connected to the connecting terminal through the first via hole and the third via hole;
a size of an opening on a side, facing the connecting terminal, of the third via hole is smaller than a size of a surface of a side, facing the third via hole, of the connecting terminal; and
a side face of the connecting terminal and an edge area of the surface of the side, facing the third via hole, of the connecting terminal are coated by the second passivation layer, so that the second passivation layer coats the side face and a surface edge of the second portion of the connecting terminal.

10. The method according to claim 9, wherein
before forming the first passivation layer, the method further comprises:
providing a rigid substrate; and
forming a sacrificial layer on the rigid substrate; wherein the forming the first passivation layer comprises:
forming the first passivation layer on the sacrificial layer; and
after the preparing the electrical connecting structure, the flexible substrate and the thin film transistor on the first passivation layer, the method further comprises:
sacrificing the sacrificial layer to peel off the rigid substrate.

11. The method according to claim 10, wherein after peeling off the rigid substrate, the method further comprises:
bonding an integrated circuit chip to a side, facing away from the flexible substrate, of the first passivation layer, wherein the integrated circuit chip is electrically connected to the connecting terminal through the second via hole.

12. The method according to claim 10, wherein the preparing the electrical connecting structure, the flexible substrate and the thin film transistor on the first passivation layer comprises:
preparing the connecting terminal on the first passivation layer;
preparing the flexible substrate on the connecting terminal; and
preparing the signal trace and the thin film transistor on the flexible substrate.

13. The method according to claim 12, wherein the preparing the connecting terminal on the first passivation layer comprises:
preparing a Ti/Al/Ti laminated structure on the first passivation layer; and
forming a graph of the connecting terminal by using a dry etching process.

14. The method according to claim 10, wherein
before forming the first passivation layer, the method further comprises:
preparing a conductive material layer on the sacrificial layer, and forming a graph of the conductive structure by a composition process; wherein
the forming the first passivation layer comprises:
depositing a passivation material layer and forming the second via hole on the passivation material layer by a dry etching process, wherein the orthographic projection, on the flexible substrate, of the second via hole is located within an orthographic projection, on the flexible substrate, of the conductive structure.

15. The method according to claim 10, wherein the forming the first passivation layer comprises:
depositing a passivation material layer, wherein the passivation material layer comprises one or more of SiN, SiON and SiOx; and
forming the second via hole by performing wet etching on the passivation material layer by using a hydrogen fluoride (HF) etching solution.

16. A display device, comprising a drive backplane and a display element, wherein the drive backplane comprises:
a flexible substrate on which a first via hole is provided;
a first passivation layer located on one side of the flexible substrate, wherein the first passivation layer is provided with a second via hole, and an orthographic projection, on the flexible substrate, of the second via hole is at least partially overlapped with an orthographic projection, on the flexible substrate, of the first via hole;
a thin film transistor located on a side, facing away from the first passivation layer, of the flexible substrate; and
an electrical connecting structure, comprising a signal trace and a connecting terminal; wherein the connecting terminal is located on a side, close to the first passivation layer, of the flexible substrate and comprises a first portion located between the flexible substrate and the first passivation layer and a second portion located within the second via hole, and the orthographic projection, on the flexible substrate, of the second via hole is located within an orthographic projection, on the flexible substrate, of the connecting terminal; and the signal trace is located on the side, facing away from the first passivation layer, of the flexible substrate, is electrically connected to the thin film transistor and electrically connected to the connecting terminal through the first via hole;
wherein the drive backplane further comprises:
a second passivation layer located between the flexible substrate and the connecting terminal,
wherein the second passivation layer is provided with a third via hole, the third via hole and the first via hole penetrate through each other along a thickness direction of the second passivation layer, and the signal trace is electrically connected to the connecting terminal through the first via hole and the third via hole;
a size of an opening on a side, facing the connecting terminal, of the third via hole is smaller than a size of a surface of a side, facing the third via hole, of the connecting terminal; and
a side face of the connecting terminal and an edge area of the surface of the side, facing the third via hole, of the connecting terminal are coated by the second passivation layer, so that the second passivation layer coats the side face and a surface edge of the second portion of the connecting terminal.

* * * * *